United States Patent
Kawamata et al.

(10) Patent No.: US 7,705,304 B2
(45) Date of Patent: Apr. 27, 2010

(54) SCANNING ELECTRON MICROSCOPE AND THREE-DIMENSIONAL SHAPE MEASURING DEVICE THAT USED IT

(75) Inventors: Shigeru Kawamata, Hitachinaka (JP); Yoshinobu Hoshino, Hitachinaka (JP); Asako Kaneko, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 157 days.

(21) Appl. No.: 12/120,053

(22) Filed: May 13, 2008

(65) Prior Publication Data

US 2008/0283747 A1 Nov. 20, 2008

(30) Foreign Application Priority Data

May 14, 2007 (JP) ............................. 2007-127976

(51) Int. Cl.
*H01J 49/40* (2006.01)
(52) U.S. Cl. ...................................... 250/310; 250/397
(58) Field of Classification Search ................. 250/310, 250/397
See application file for complete search history.

(56) References Cited

U.S. PATENT DOCUMENTS

2008/0073533 A1* 3/2008 Makino et al. .............. 250/310

FOREIGN PATENT DOCUMENTS

| JP | 62-6112 A | 1/1987 |
|---|---|---|
| JP | 2002-31520 A | 1/2002 |

* cited by examiner

*Primary Examiner*—Kiet T Nguyen
(74) *Attorney, Agent, or Firm*—Crowell & Moring LLP

(57) ABSTRACT

In three-dimensional shape measurement, a backscattered electron detection signal and selection signal generator in a control section controls, by selection signal, a signal switching section and a frame memory so that: detection signals from respective semiconductor elements are sequentially switched in the signal switching section in synchronization with a scanning frame of an electron beam on a sample; and the detection signals from the respective semiconductor elements can be sequentially recorded in recording addresses in the frame memory which correspond to the respective semiconductor elements. After four electron beam scanning sessions, each image data for three-dimensional shape measurement is recorded in the frame memory, and processed in a computing processing section for three-dimensional shape measurement, and the result can be displayed in a display section. The backscattered electron detection signal and selection signal generator in the control section is configured to include, for example, a counter updated in frame scanning units, and can be composed of a very simple circuit or software.

8 Claims, 8 Drawing Sheets

(a) In regular image observation (b) In three-dimensional measurement

SCANNING ELECTRON MICROSCOPE AND THREE-DIMENSIONAL SHAPE MEASURING DEVICE THAT USED IT

BACKGROUND OF THE INVENTION

1. Field of the Invention

The present invention relates to a scanning electron microscope and a three-dimensional shape measuring device that used it, and, in particular, relates to a three-dimensional shape measuring device provided with a multiply-segmented backscattered electron detector.

2. Description of the Related Art

There are several conventional techniques available for three-dimensional shape measurement using a scanning electron microscope. The three-dimensional shape measurement techniques include: a method based on a feature point shift of a stereo pair image obtained by causing a sample or an incident electron beam to be inclined; and a method based on the difference among signals detected by multiple detectors arranged uniformly with respect to a sample. A representative example of the latter method is a three-dimensional shape measuring device including a backscattered electron detector, which is arranged in a circular pattern facing a sample, equally-segmented in a radial manner. The device is configured to measure a surface shape of a sample on the basis of the difference among directional detection signals from detection elements respectively provided in the segmented backscattered electron detector (refer to FIG. 1 in Japanese Unexamined Patent Application Publication No. Sho 62-6112 and Japanese Patent Application Publication No. 2002-31520).

SUMMARY OF THE INVENTION

FIG. 1 is a drawing illustrating a configuration example of a commonly-used scanning electron microscope having a function of measuring a three-dimensional shape of a sample surface. In the scanning electron microscope illustrated in FIG. 1, a sample 4 is irradiated with an electron beam 2 which has been generated from an electron gun 1 and then has been converged by a focusing lens 3. The electron beam 2 is caused to scan the surface of the sample 4 by a deflection coil 5. A backscattered electron emitted from the sample 4 is detected by a backscattered electron detector 6. Detection signals from the backscattered electron detector 6, which are signals from detection elements 6a to 6d obtained by segmenting the backscattered electron detector 6, are each subjected to a computation processing, such as addition and subtraction, in a signal switching section 7, converted to digital image data by an A/D converter 8, and then recorded in a frame memory 9. The image data recorded in the frame memory 9 is outputted to a display device 10 in real time so as to be displayed as a two-dimensional observation image. The backscattered electron detector 6 is composed of semiconductor elements unitedly having a donut-shaped effective detection surface with the electron beam 2 as the center axis. The backscattered electron detector 6 is radially segmented into four semiconductor elements, as indicated as by 6a to 6d, and it is configured that a detection signal can be obtained from each of the segmented semiconductor elements 6a to 6d.

The backscattered electron from the sample 4 is emitted in a distribution mainly along a specular reflection direction with respect to an incident angle of the electron beam 2 to the sample 4 due to unevenness of the surface of the sample 4, and then detected by one of the elements of the backscattered electron detector 6. In regular observation, detection signals from the respective elements 6a to 6d are added together. However, by performing subtraction on a detection signal of an element and a detection signal of another element located in an opposed position, it is also possible to observe an image emphasizing unevenness information of the sample surface. Devices which have such a function for arithmetic processing among elements and are capable of changing observation modes have been widely used.

Next, a description will be given of a technique for three-dimensional shape measurement. A backscattered electron reflected from a sample is detected by any one of the semiconductor elements 6a to 6d according to the direction of the emission of the signal. Since a distribution of the backscattered electrons contains unevenness information of the surface of the sample, the detection signals from the respective semiconductor elements are amplified, each converted, into digital image data, by one of four A/D converters 11 provided for the respective semiconductor elements, and then recorded in a frame memory 12. Thereafter, a height distribution of the sample surface can be obtained by performing a two-dimensional integration using an equation 1 shown below by a computation processing section 13.

On the basis of the height distribution information, the computation processing section 13 is further capable of creating a cross-sectional profile of the sample, displaying a bird's eye view, measuring a roughness parameter, and even displaying a three-dimensional model. These results obtained by the computation processing section 13 are displayed in a three-dimensional shape measurement result display section 14. In this case, it is necessary to independently record the detection signals from the respective semiconductor elements 6a to 6d in order to calculate a height distribution. Accordingly, it is required to provide signal amplifiers and A/D converters 11 both of the same number as the number of the segmented elements of the backscattered electron detector 6, and also to provide frame memories 12 for each segmented element in order to record, in parallel, multiple detection data detected by these signal amplifiers and A/D converters.

As described above, it is configured in a conventional three-dimensional shape measuring device that detection signals from a multiply-segmented backscattered electron detector are each amplified by one of the equivalent number of signal amplifiers, each converted into a digital signal by the A/D converter, and then subjected to computation processing for three-dimensional shape measurement. However, in the configuration of a backscattered electron detector installed in a commonly-used scanning electron microscope, it is not necessary in regular two-dimensional structure observation of a sample surface to separately take in backscattered electron signals of the same number as the number of the segmented elements. Accordingly, the signal amplifier in that backscattered electron detector is configured so as to obtain a sum of multiple detection signals or a difference signal among multiple detection signals, depending on observation modes, such as those for composition and unevenness. In such a configuration, the backscattered electron signals can be input as a single detection signal to the image display section. Meanwhile, in the case of performing three-dimensional measurement, it is necessary to provide signal amplifiers and A/D converters both of the same number as the number of the segmented elements of the backscattered electron detector, and also necessary to provide image memories in order to record, in parallel, multiple detection data detected by these signal amplifiers and A/D converters. Hence, the device is larger, and the cost thereof is higher.

In addition, computation based on a difference among multiple detection signals is performed in three-dimensional shape measurement. In order to improve the measurement accuracy, it is necessary to increase the number of effective figures of the number of quantization of a detection signal by an A/D converter. Therefore, there is a problem that multiple expensive A/D converters have to be provided in that backscattered electron detector.

The present invention aims to simplify the structure of a scanning electron microscope which utilizes a multiply-segmented backscattered electron detector.

In a scanning electron microscope provided with a multiply-segmented backscattered electron detector having, for example, a circular shape for detecting a backscattered electron emitted from the surface of a sample, a three-dimensional shape measuring device according to the present invention is characterized by including: a means for switching a detection signal of the segmented backscattered electron detectors; frame memories of the same number as the number of the divisions of the backscattered electron detector; and a means for switching, for every detection of a signal of one frame, the detection signals and frame memories for recording the detection signals. By having such a configuration, it is possible to perform three-dimensional shape measurement by obtaining image data of frames of the same number of the number of the divisions, and then performing computation processing of the obtained data.

In addition, it is characterized that the above-described scanning electron microscope includes: a means for switching detection signals from the segmented backscattered electron detector; frame memories of the same number as the number of the divisions of the backscattered electron detector; and a means for switching, for every signal detection of a single line unit, the detection signals and the frame memories for recording the detection signals. It is possible to perform three-dimensional shape measurement by obtaining image data of frames of the same number of the number of the divisions, and then performing computation processing of the obtained data.

In the computation processing for three-dimensional shape measurement, it is necessary that detected data represent an absolute amount of a backscattered electron signal. FIG. 3 is a drawing illustrating an example of a backscattered electron image and its histogram. In a regular image observation shown in FIG. 3A, the contrast and brightness of the image are accordingly adjusted and shown on display so that the surface structure of the sample can be observed more easily. However, the image data does not represent the absolute value of a backscattered electron signal, and contains the amount of offset due to brightness adjustment. The amount of offset is altered by adjustment of the brightness. In this case, in the three-dimensional shape measurement, the following equation shown in an equation 3 in the above Japanese Patent Application Publication No. 2002-31520 is used as a basic calculation formula for the amount of height change $\Delta Z$. Accordingly, the amount of offset is an error factor in height measurement. In this equation, A and B are the amount of signals detected respectively by detection elements located radially opposed to each other in the detector while a minute section from P1 and P2 on a sample in an x direction is being scanned.

$$\Delta Z = \int_{P1}^{P2} \frac{A-B}{A+B} dx \qquad \text{Equation 1}$$

In a conventional dedicated device, a brightness adjusting mechanism for a detection signal of a backscattered electron is not provided so that such offset will not occur.

The device according to the present invention in the above-described scanning electron microscope provided with a brightness adjusting mechanism in regular image observation includes: a means for beam blanking for preventing irradiation of a sample with a primary electron beam; and a means for setting brightness so that image data by the backscattered electron detector can be zero in a state where the electron beam irradiation on the sample is reduced, and for retaining the setting until the completion of the acquisition of data for three-dimensional shape measurement.

The means for setting brightness firstly sets a known brightness value Bd, acquires image data Dd obtained in a state where a sample is not irradiated with an electron beam, and calculates, according to the relationship between the image data Dd and a brightness set value Bd, a brightness set value Bs, at which image data is zero, by using the following equation. In this case, Kb is a brightness set value difference (brightness sensitivity) required for changing the image data by one.

$$Bs=Bd-(Dd\times Kb) \qquad \text{Equation 2}$$

Image data involved in regular image observation is 8 bits (256 shades of gray) in the case of a black-and-white image, due to the constraint of a display. With 256 shades of gray, a sufficient level of image contrast expression for the nature of human visual feature can be achieved. However, in the three-dimensional shape measurement in which the brightness is fixed as described above, if detailed differences in shading, which represent a sample structure, are to be observed by emphasizing the contrast, the whole image would be brighter, resulting in the image data being saturated by over exposure.

In a conventional dedicated device, image contrast is kept low so as to cause no image data saturation. At the same time, in order to achieve the measurement accuracy by increasing the quantization resolution of image data, A/D converters and image memories are configured so that image data can be processed with 12 bits (4,096 shades of gray) or 16 bits (65,536 shades of gray) of resolution.

In the device according to the present invention, in order to reduce a quantization error of image data obtained in three-dimensional shape measurement as much as possible, the contrast is set so that image data can adequately disperse without being saturated. In this configuration, the number of bits of the individual A/D converter can be reduced. The means for contrast setting is configured to: acquire image data obtained in a known contrast setting; calculate a maximum value of image data of a single frame; and obtain an optimal contrast set value by multiplying a contrast set value by the ratio between the maximum value and a full scale value.

According to the present invention, it is possible to easily perform three-dimensional shape measurement without providing any dedicated device in a scanning electron microscope provided with a multiply-segmented backscattered electron detector for detecting backscattered electron emitted from the surface of a sample.

DESCRIPTION OF THE PREFERRED EMBODIMENT

Figure 1:
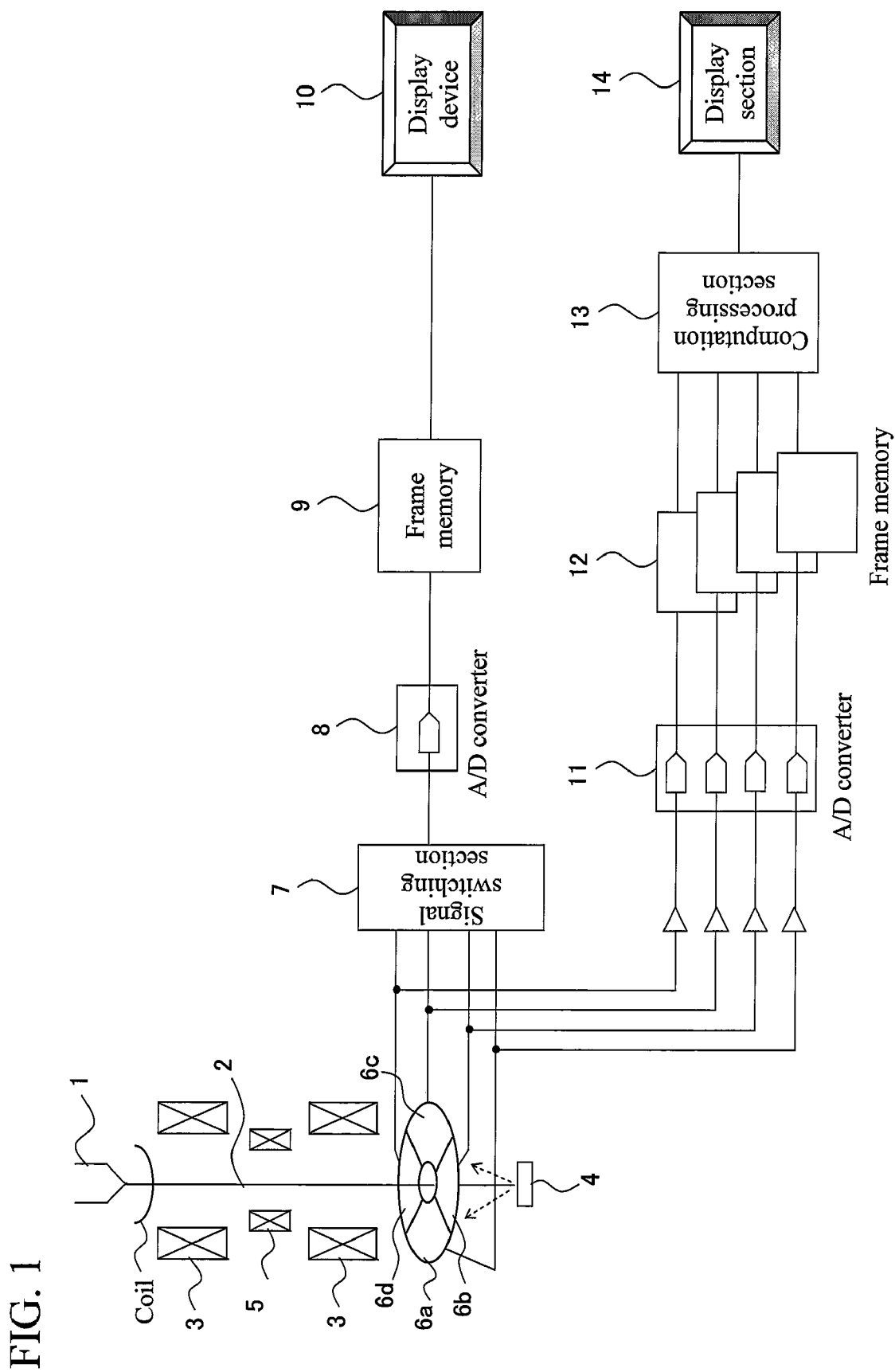
FIG. 1 is a configuration diagram illustrating a commonly-used scanning electron microscope provided with a three-dimensional shape measurement dedicated device.

This application is based on the Japanese Patent application JP2007-127976, all the contents of which are incorporated in this application by reference.

In the following section, a description will be given of a scanning electron microscope according to a first embodiment of the present invention by referring to the drawings.

Figure 2:
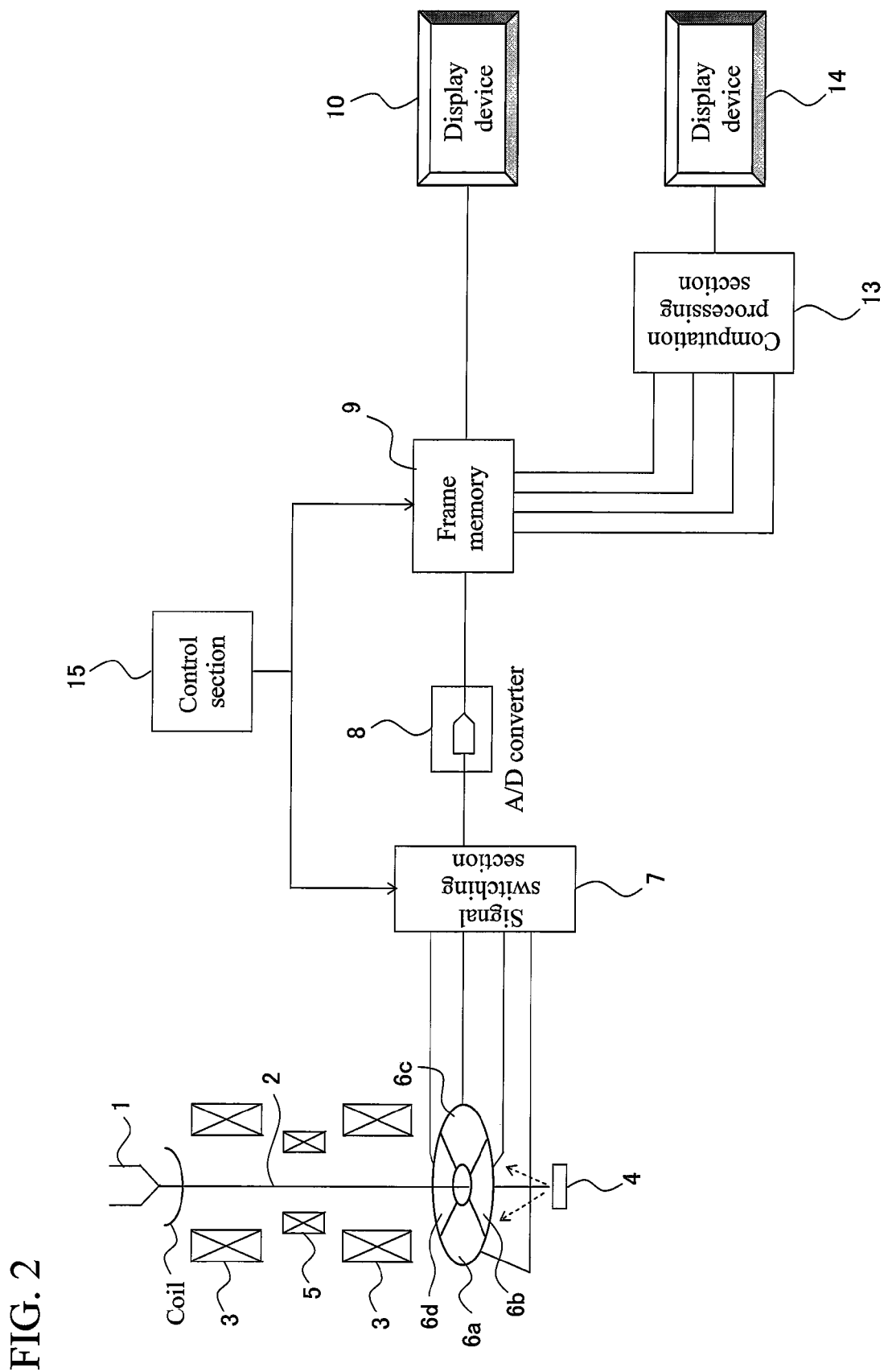
FIG. 2 is a drawing illustrating a configuration example of a scanning electron microscope according to a first embodiment provided with a three-dimensional shape measurement dedicated device.

FIG. 2 is a drawing illustrating a configuration example of a scanning electron microscope according to the present embodiment. The configuration from an electron source 1 to signal detection in a backscattered electron detector 6 is the same as that illustrated in FIG. 1. The operation in regular observation up to a display device 10 is also the same as that in the case illustrated in FIG. 1. In three-dimensional shape measurement, a backscattered electron detection signal and selection signal generator located in a control section 15 controls a signal switching section 7 and a frame memory 9 by a selection signal. To be more specific, the backscattered electron detection signal and selection signal generator is configured to operate so that: detection signals from respective semiconductor elements 6a to 6d are sequentially switched in the signal switching section 7 in synchronization with a scanning frame of the electron beam 2 on the sample 4; and then the detection signals from the respective semiconductor elements 6a to 6d can be sequentially recorded in a corresponding recording address in the frame memory 9.

In other words, during a first frame scanning session, the signal switching section 7 and the recording addresses in the frame memory 9 are set so that a detection signal from the semiconductor element 6a can be selected. During a second frame scanning session, the signal switching section 7 and the recording addresses in the frame memory 9 are set so that a detection signal from the semiconductor element 6b can be selected. During a third frame scanning session, the signal switching section 7 and the recording addresses in the frame memory 9 are set so that a detection signal from the semiconductor element 6c can be selected. During a fourth frame scanning session, the signal switching section 7 and the recording addresses in the frame memory 9 are set so that a detection signal from the semiconductor element 6d can be selected.

By these four sessions of electron beam scanning, it is possible to: record image data for three-dimensional shape measurement in the frame memory 9; process the image data in a computation processing section 13 for three-dimensional shape measurement; and display a result thus obtained in the display section 14. Being configured to include a counter, which is updated in frame scanning units, and the like, the backscattered electron detection signal and selection signal generator located in the controlling section 15 can be made with a very simple circuit or software. For example, according to the present embodiment, unlike the configuration illustrated in FIG. 1, it is not necessary to provide, exclusively for three-dimensional shape measurement, the A/D converters 11 and the frame memories 12 both of the same number as the number of the segmented elements of the backscattered electron detector 6. Therefore, there are advantages that the system can be made smaller and produced at low cost.

An example in which signals are switched in frame scanning units has been described in the above description given of FIG. 2. It should be noted, however, that it is possible to switch signals not only in frame scanning units but also in line units. In the case of switching in line units, the backscattered electron detection signal and selection signal generator located in the control section 15 is configured to operate so that the semiconductor elements 6a to 6d are sequentially selected and recorded by the signal switching section 7 and corresponding recording addresses in the frame memory 9 in synchronization with a scanning line of the electron beam 2 on the sample 4. To be more specific, during a first line scanning session, the signal switching section 7 and the recording addresses in the frame memory 9 are set so that a detection signal from the semiconductor element 6a can be selected. During a second line scanning session, the signal switching section 7 and the recording addresses in the frame memory 9 are set so that a detection signal from the semiconductor element 6b can be selected. During a third line scanning session, the signal switching section 7 and the recording addresses in the frame memory 9 are set so that a detection signal from the semiconductor element 6c can be selected. During a fourth line scanning session, the signal switching section 7 and the recording addresses in the frame memory 9 are set so that a detection signal from the semiconductor element 6d can be selected. Then, during a fifth line scanning session, the signal switching section 7 and the recording addresses in the frame memory 9 are controlled so that the operation can go back to the semiconductor element 6a. When recording of the final line is finished, the acquisition of image data for three-dimensional shape measurement is completed. The switching operation in line units has an advantage over the above-described switching operation in frame units that the impact of displacement among image data respectively detected by the semiconductor elements 6a to 6b due to sample drift can be reduced. In high-magnification observation, there are problems of: shift in a relative position of the electron beam 2 and the sample 4 due to various factors; and sample deformation. In the switching operation in frame units, the period from after recording detected image data of one frame to recording an equivalent position in the next frame is the same as the amount of time required for scanning a single frame. Accordingly, during the period, there is a risk of a displacement caused by shift and sample deformation. In contrast, in the switching operation in line units, the period from after recording a position of one line to recording an equivalent position in the next line is equal to the scanning time of a single line. For example, if there are 500 scanning lines, the time required for line scanning would be $\frac{1}{500}$ of that for frame scanning, and the displacement as well can be reduced to $\frac{1}{500}$.

In the following section, a description will be given of a scanning electron microscope device according to a second embodiment of the present invention by referring to FIGS. 4, 5, and then 3, and a comparison between the device and a commonly-used device will also be given.

Figure 4:
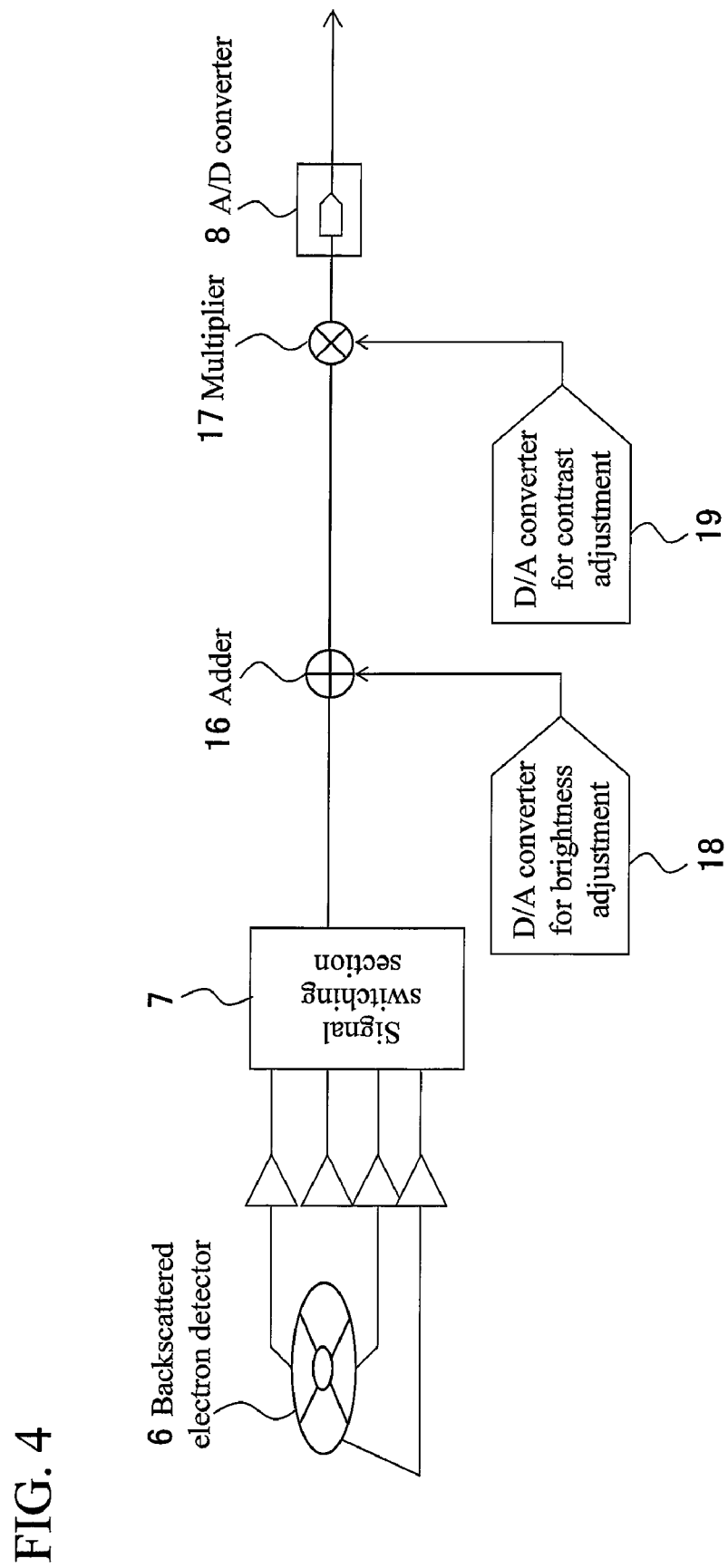
FIG. 4 is a drawing illustrating a configuration example of a video signal processing section provided in a common backscattered electron detector in regular image observation.
Figure 5:
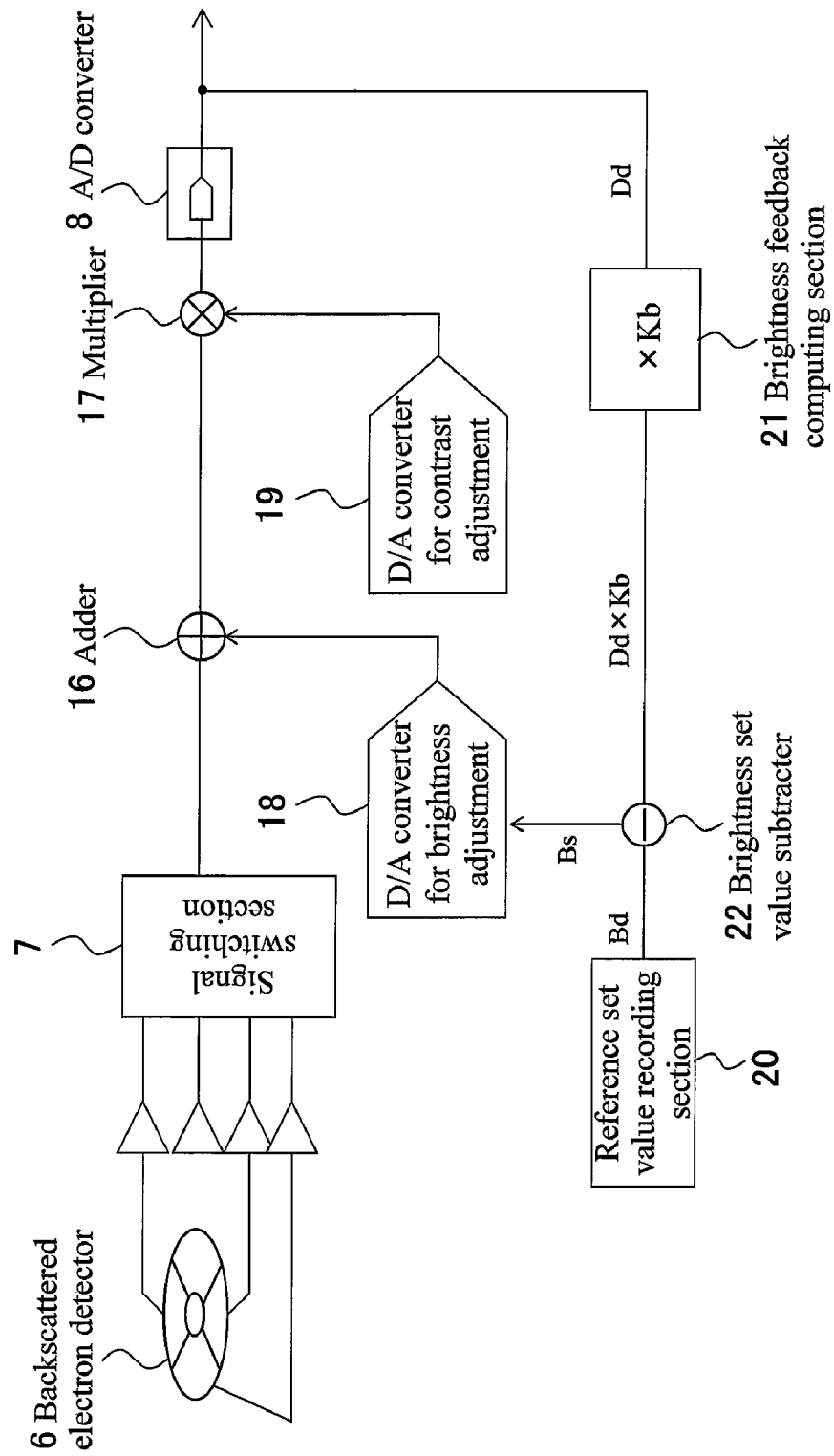
FIG. 5 is a drawing illustrating a configuration example of a video signal processing section provided in a backscattered electron detector, in which brightness setting is automated, according to a second embodiment.

FIG. 4 is a drawing illustrating a configuration example of a video signal processing section provided in a commonly-used backscattered electron detector. A backscattered electron detector 6 in a circular shape segmented in quarters by lines extending radially from the center of the circle, a signal switching section 7, and an A/D converter 8 are equivalent to those provided in the device according to the first embodiment. It should be noted that a detailed configuration between the signal switching section 7 and the A/D converter 8, which is omitted to be shown in FIGS. 1 and 2 described above, is actually similar to the configuration illustrated in FIG. 4. To be more specific, as shown in FIG. 4, an output signal from the signal switching section 7 and a brightness signal outputted from a D/A converter 18 are added to each other in an adder 16, and a value thus obtained is multiplied by a contrast signal outputted from a D/A converter 19. Then, a value thus obtained is outputted to the A/D converter 8 and therein converted into digital data. It is possible to adjust the brightness and contrast of an image by changing a set value each in the brightness adjusting D/A converter 18 and the contrast adjusting D/A converter 19 according to an instruction from an unillustrated operation section. In regular image observation, the brightness and contrast are adjusted by an observer observing a live image displayed on a display device 10 so as to achieve an appropriate contrast of the image.

Figure 3:
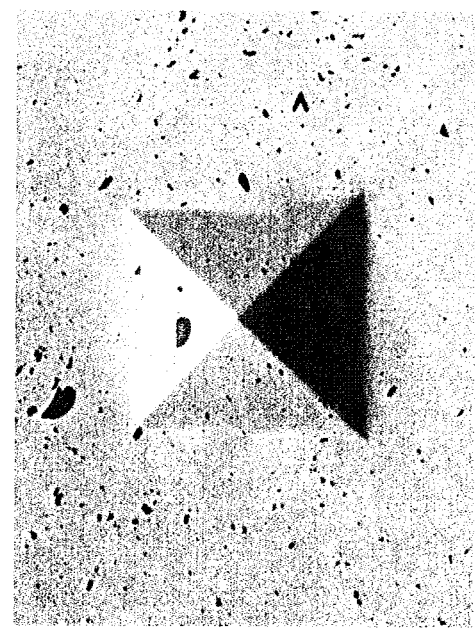
FIG. 3A is a drawing illustrating a backscattered electron image and its histogram during regular image observation.
FIG. 3B is a drawing illustrating a backscattered electron image and its histogram during three-dimensional measurement.
Figure 3:
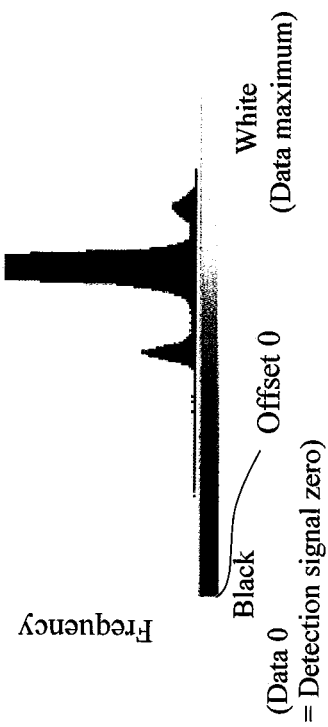
Figure 3:
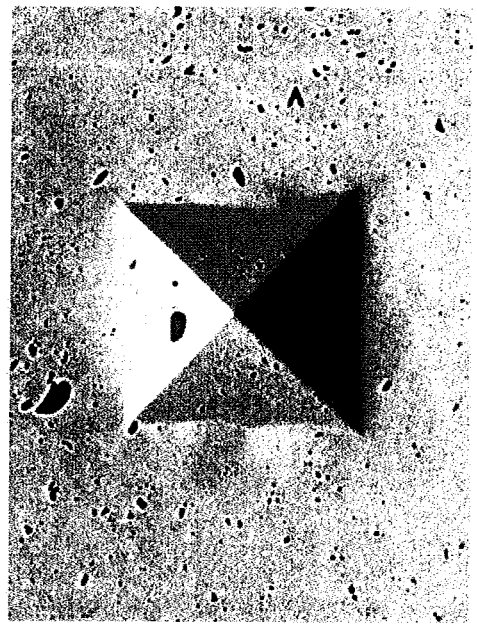
Figure 3:
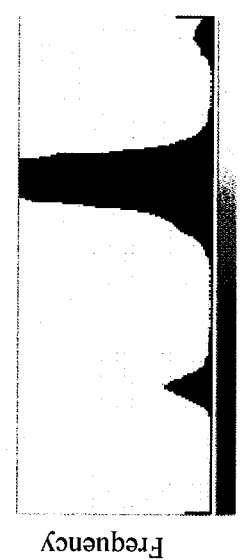

FIG. 3A is an example of a backscattered electron image (upper drawing) and its histogram. A sample is a Vickers indent formed on the surface of SUS, and the image is taken while selecting only a detection element facing in the downward direction of the image. Since the composition of the sample is uniform, a signal from a flat part other than the indent is shown as a peak in the histogram. According to this histogram, the brightness and contrast are adjusted such that minute dents and the indentation part on the SUS surface can have appropriate contrast.

FIG. 3B is a drawing illustrating an example in which the brightness is set such that image data can be data 0 when there is no electron beam irradiation, in other words, when the detection signal is zero, while the contrast is adjusted appropriately. In the comparison between the histograms in FIG. 3A and FIG. 3B, it is obvious that, in FIG. 3A compared to FIG. 3b, the contrast has been increased (the histogram has been widened) while the brightness has been decreased (the histogram has been shifted to the left in order to provide an offset) so that a feature part will not be saturated by over exposure.

Figure 6:
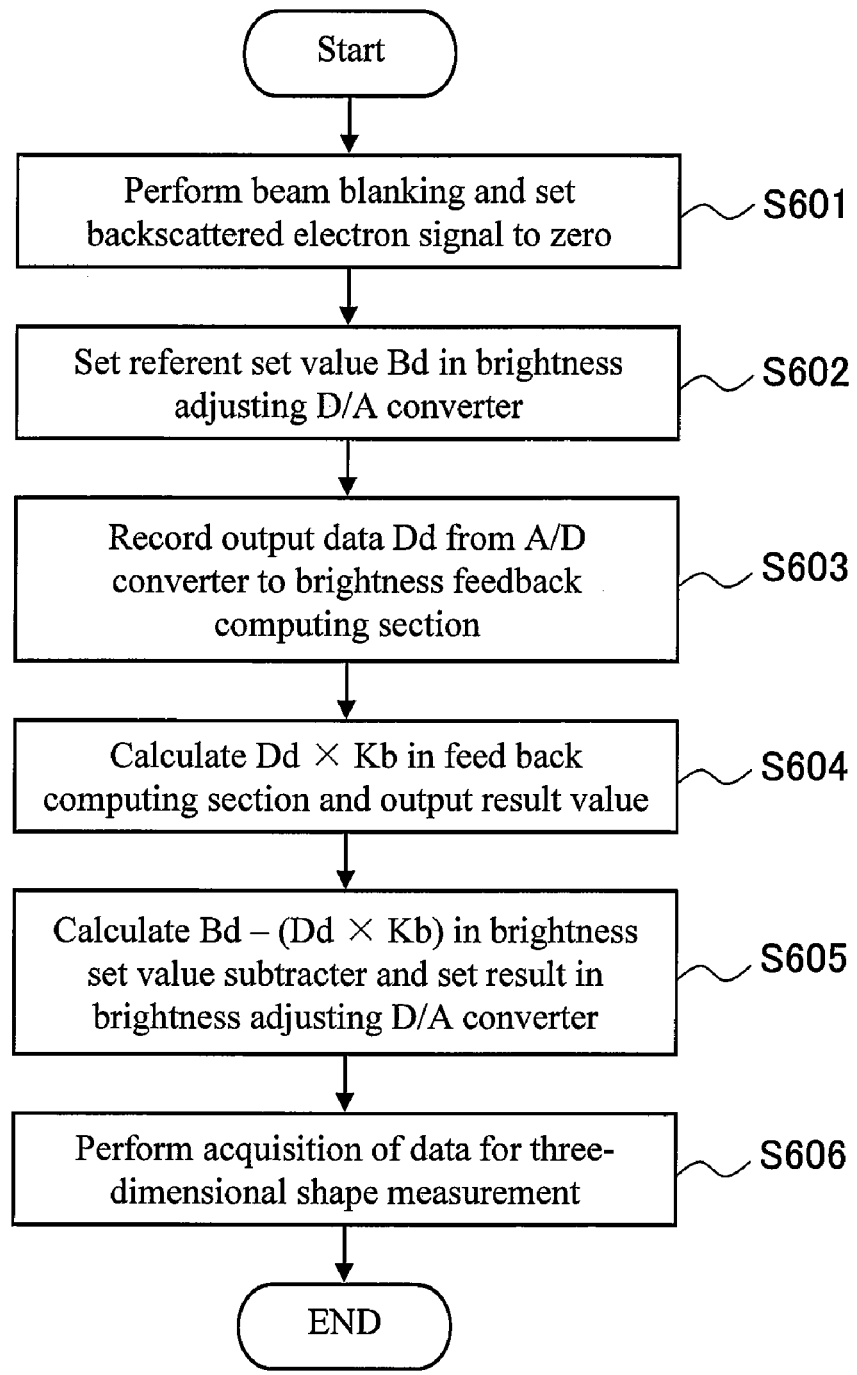
FIG. 6 is a flowchart illustrating a flow of the process of brightness adjustment.

However, the three-dimensional shape measurement shown in FIG. 3B requires the detection signal zero to be data 0, as indicated by the above equation 1, and the amount of shift (the amount of offset) is an error factor in calculation of the amount of height variation. FIG. 5 illustrates a configuration example for automatic setting of the amount of offset, and the drawing in FIG. 5 corresponds to the configuration example illustrated in FIG. 4. Meanwhile, FIG. 6 is a flowchart illustrating a processing flow of brightness adjustment. In the following section, the procedure of the automatic setting of the amount of offset will be described.

Once the processing is initiated (Start), firstly, in the configuration illustrated in FIG. 2, the amount of a backscattered electron signal is adjusted to zero while beam blanking is performed by, for example, turning off filament heat in the electron gun 1, and/or providing a large amount of displacement in optical axis adjustment with use of a coil or the like, so that the sample 4 will not be irradiated with the electron beam 2 (Step S601). As shown in FIG. 5, a brightness referent set value Bb, which is obtained when the amount of backscattered electron is set to zero, is set in a reference set value recording section 20 (Step S602), and output data Dd from the A/D converter 8 at this point is recorded in a brightness feedback computing section 21 (Step S603). It should be noted that the initial value of the brightness feedback computing section 21 is set to zero.

Next, a regular measurement state is achieved by releasing the amount of backscattered electron signal from zero. In the brightness feedback computing section 21, the recorded output data Dd of the A/D converter 8 is multiplied by the ratio Kb between the brightness setting and output data (Dd×Kb), and a value thus obtained is outputted (Step S604). A value Bs obtained in the brightness set value subtracter 22 by subtracting Dd×Kb from the brightness reference set value Bd of the reference set value recording section 20 is set in the brightness adjusting D/A converter 18 (Step S605). An output signal from the signal switching section 7 and the brightness signal Bs outputted from the D/A converter 18 are added to each other in the adder 16.

By going through this procedure, the amount of offset in a histogram can be set to zero as shown in FIG. 3B. In this state, the acquisition of data for three-dimensional shape measurement is performed (Step S606). The reference set value recording section 20, the brightness feedback computing section 21, and the subtracter 22 may be composed of hardware, or may be replaced by software processing. According to the present embodiment, the amount of offset, which is an error factor in three-dimensional shape measurement, due to brightness adjustment can be automatically set to zero. Accordingly, it is possible not only to improve operability in three-dimensional shape measurement, but also to reduce measurement error due to offset.

The means for performing brightness adjustment so as to set image data to "0" has been described in the above section. It should be noted that the same result can be obtained by subtracting image data obtained when the detection signal is zero from image data obtained for three-dimensional shape measurement. In such a case, the subtracter 22 in FIG. 5 can be omitted. The procedure in this case includes the following steps: recording the output data Dd from the A/D converter 8 while performing the beam blanking by using the above-described means; releasing the amount of backscattered electron signal from zero to achieve the regular measurement state, and then performing the acquisition of data for three-dimensional shape measurement; and recording the data for measurement in the frame memory 9 in the configuration illustrated in FIG. 2. Three-dimensional shape measurement, in which the amount of offset due to brightness setting is taken into consideration, can be performed by subtracting the data Dd obtained when there is no signal, from the data obtained for measurement when the operation for three-dimensional measurement is performed in the operation processing section 13 in the configuration illustrated in FIG. 2. The following equation is used for this three-dimensional measurement.

$$\Delta Z = \int_{P1}^{P2} \frac{(A - Dd) - (B - Dd)}{(A - Dd) + (B - Dd)} dx \qquad \text{Equation 3}$$

Figure 7:
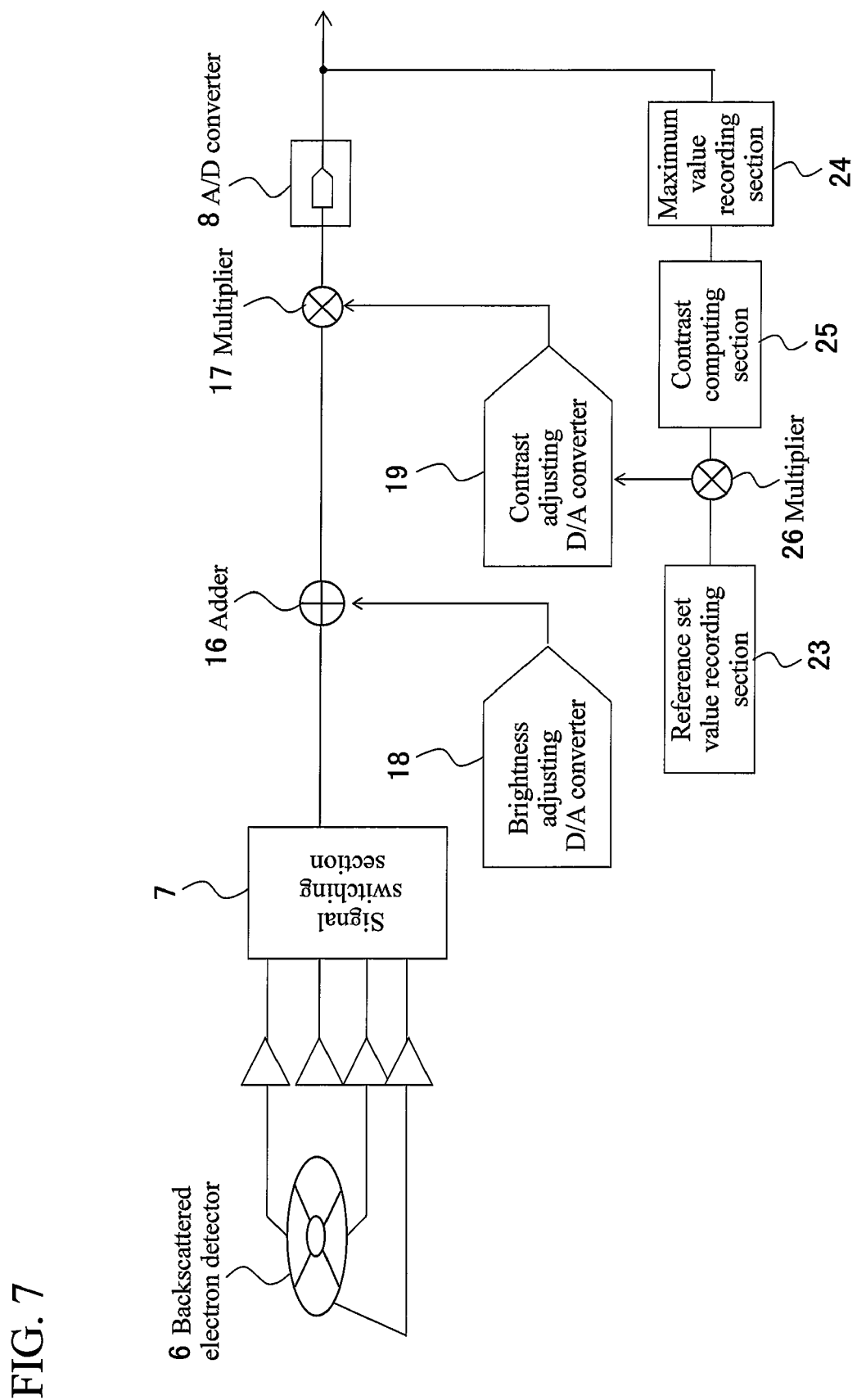
FIG. 7 is a drawing illustrating a configuration example of a video signal processing section of a backscattered electron detector, in which contrast setting is automated, according to a third embodiment.

Next, a description will be given of a scanning electron microscope device according to a third embodiment of the present invention by referring to FIG. 7. FIG. 7 is a drawing illustrating a function of a video signal processing section provided in a backscattered electron detector in which contrast setting is automatically carried out. In the brightness setting for three-dimensional shape measurement described above, since the saturation of image data occurs, the contrast of display image cannot be set to a sufficiently large value. When the contrast set value is smaller, the quantization error of image data is larger. Accordingly, the accuracy of three-dimensional shape measurement is reduced. Therefore, in the case of a dedicated device, it is necessary to increase the number of bits in the A/D converter 8 to 12 bits, 16 bits, or the like. In the present embodiment, it is configured that the contrast is automatically adjusted so that: the quantization error will be minimized; and the maximum value of detected image data will correspond with the full scale of the A/D converter 8.

Firstly, a contrast reference set value is set in a reference set value recording section 23. At this state, electron beam scanning is performed on one frame. The maximum value of obtained image data from the scanning is recorded in a maximum value recording section 24. Then, the ratio between the maximum value and a full scale value of the A/D converter 8 (for example, 255 for an 8-bit A/D converter) is calculated in a contrast computing section 25. In a contrast set value multiplier 26, the ratio is multiplied by the contrast reference set value, and a value thus obtained is set in a contrast adjusting D/A converter 19. Thus, when the acquisition of image data is performed in such a condition set by the above-described steps, the maximum value of image data can correspond with the full scale of the A/D converter 8. It should be noted that the contrast reference set value is set to be sufficiently small so that image data will not be saturated in scanning during the automatic contrast setting processing.

It should be noted that the functions of the reference set value recording section 23, the maximum value recording section 24, the contrast computing section 25, and the contrast multiplier 26 can be substituted by software processing. According to the present embodiment, contrast setting in three-dimensional shape measurement can be automated. Accordingly, all obtained image data have the optimal contrast; therefore, a quantization error can be minimized. Due to the minimized quantization error, it is possible to reduce the number of bits in the A/D converter 8 and the frame memory as small as possible; thus, the system can be smaller, and the production cost thereof can be reduced.

An example in which the maximum value of image data is matched with the full scale value of the A/D converter 8 has been described above. If time variation of a detection signal is taken into consideration, it is possible to automatically adjust contrast so that the maximum value of image data matches any appropriate value, such as a value set to be 90% of the full scale value. For such an adjustment, calculation is performed in the contrast computing section 25 to obtain the ratio between the maximum value and 90% of the full scale value of the A/D converter 8. According to the present embodiment, even if the detection signal is slightly increased due to its time variation, it is possible to prevent the maximum value of image data from being saturated as going over the full scale of the A/D converter 8.

In the following section, another method for automating contrast setting will be described. The method is not based on the maximum value of image data but based on a histogram. The method includes the following steps: acquiring a histogram of image data obtained in an electron beam scanning; calculating the ratio between an image data value representing a predetermined percentage, for example 80%, of a total frequency, and a predetermined target image data value; and setting, in the contrast adjusting D/A converter 19, a value obtained by multiplying the contrast reference set value and the ratio.

In the following section, a description will be given of a specific example in the case of using image data having a size of 640×480 pixels. The total frequency is 307 and 200. In the above-described example of having a frequency of 80% of a total frequency, image data values at which the sum of the frequencies from the image data 0, which is the data representing black, is 80% of the total frequency, 245 and 160, respectively, are obtained from the histogram. The ratio is calculated between each of the image data values and a predetermined image data value which is expected to be appropriate for the 80% frequency. By multiplying the ratio by the contrast reference set value, an automatic set value of the contrast is obtained. For example, when only a small part of an image is over exposed and the contrast is set in accordance with the maximum value of the small part, the contrast for the other most parts of the image could weaken. By adopting the method described above, however, such a problem can be avoided. For example, in observation of an image having a foreign piece attached thereto, it is also possible to perform automatic adjustment providing the optimal contrast.

It should be noted that these contrast automatic adjustment means are not limited to be applied to three-dimensional shape measurement and backscattered electron detection signal, and can also be effectively applied to brightness adjustment of display image in regular image observation.

In the above section, the optimal setting method for contrast adjustment of backscattered electron detection signal has been described. In the following section, focusing on detection signals from respective elements 6a to 6d obtained by segmenting the backscattered electron detector 6, a description thereof will be given. In regular backscattered electron image observation, detection signals obtained from the respective elements 6a to 6d are added. In the meantime, image data of the number of the segmented elements are acquired by selecting the elements 6a to 6d one by one in three-dimensional shape measurement. Accordingly, due to variation in area among the elements, the detected amount in each of the elements comes close to the value obtained by dividing the detected amount obtained by adding all the elements, by the number of the segmented elements. When the surface of the sample 4 is flat, the detected amount in each of the elements is approximately equal to the value obtained by dividing the total detected amount by the number of the segmented elements. However, since the orientation of a backscattered electron is derived from unevenness of the surface of the sample 4, the detection amounts of the respective elements vary relative to the amount in a flat part due to the unevenness.

Furthermore, in three-dimensional shape measurement, the ratio of the difference among the detected values of the respective elements is calculated. Accordingly, the contrast setting has to be constant during the acquisition of image data in the individual elements. In addition, it is desired that the contrast be adjusted so as to avoid the saturation of image data due to excessive contrast in all the image data of the elements.

Figure 8:
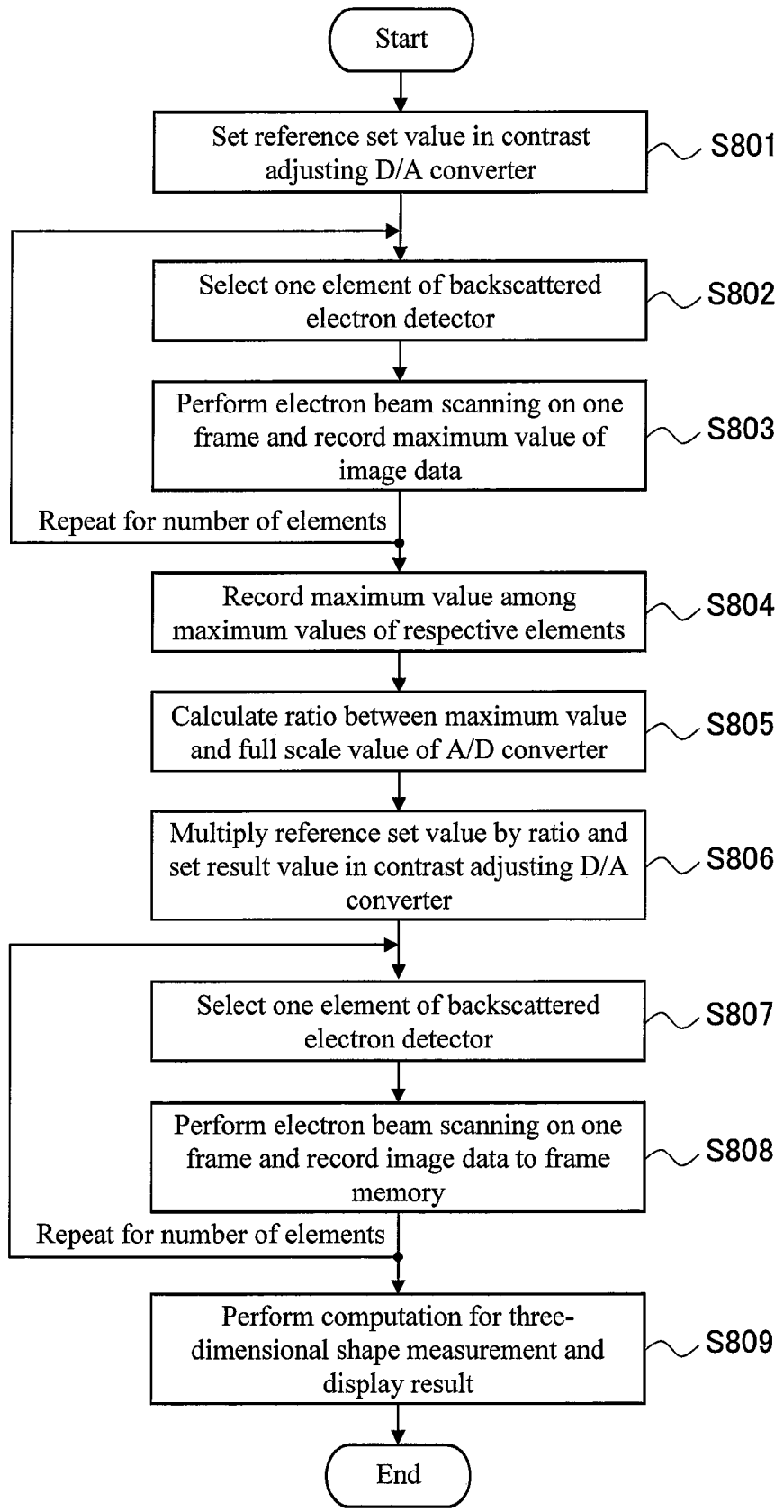
FIG. 8 is a flowchart illustrating a flow of the process of automation of contrast adjustment.

These points should be taken into consideration in the automatic contrast adjustment processing in the previous embodiment. FIG. 8 is a flowchart illustrating a flow of the automatic adjustment processing configured to deal with these points.

As shown in FIG. 8, the processing is initiated (Start), and then a reference set value is set in the contrast adjusting D/A converter 19 (Step S801). One of the elements in the backscattered electron detector 6 is selected (Step S802). One frame is scanned by an electron beam, and a first maximum value of image data is recorded (Step S803). The processing from Steps S802 to S803 is repeated for the same number of times as the number of the segmented elements of the backscattered electron detector 6. A second maximum value, which is the maximum value among the first maximum values of the recorded image data, is obtained and recorded (Step S804). The ratio is calculated between the second maximum value and the full scale value of the A/D converter 8 (Step S805). The reference set value is multiplied by the ratio obtained in Step S805, and a value thus obtained is set in the contrast adjusting D/A converter 19 (Step S806). As a result, the optimal contrast setting can be completed in the acquisition of image data in all the elements. In the condition under the optimal contrast setting, one of the elements in the backscattered element detector 6 is selected (Step S807), one frame (or one line) is scanned by an electron beam, and image data thus obtained is recorded in the frame memory 9 (FIG. 2) (Step S808). The above processing is repeated for the same number of times as the number of the segmented elements. Thereafter, a calculation is performed for the acquisition of a height distribution of the sample surface for three-dimensional shape measurement, and the result is displayed (Step S809). By this, the automatic contrast adjustment processing is completed.

As described above, according to the present embodiment, it is possible to easily perform three-dimensional shape measurement without adding a dedicated device in a scanning electron microscope provided with a multiply-segmented circular backscattered electron detector for detecting a backscattered electron emitted from the surface of a sample. Hence, there is an advantage that three-dimensional shape measurement and three-dimensional model display can be performed in a simple configuration.

The present invention is applicable to a scanning electron microscope capable of three-dimensional shape measurement.

DESCRIPTION OF SYMBOLS

1 Electron gun
2 Electron beam
3 Focusing lens
4 Sample
5 Deflection coil
6 Backscattered electron detector
7 Backscattered electron detection signal switching section
8 A/D converter
9 Frame memory
10 Display device
11 A/D converter for three-dimensional shape measurement
12 Frame memory for three-dimensional shape measurement
13 Computation processing section
14 Three-dimensional shape measurement result display section
15 Control section
16 Adder for brightness
17 Multiplier for contrast
18 Brightness adjusting D/A converter
19 Contrast adjusting D/A converter
20 Brightness reference set value recording section
21 Brightness feedback computing section
22 Brightness set value subtracter
23 Contrast reference set value recording section
24 Image data maximum value recording section
25 Contrast computing section
26 Contrast set value multiplier

What is claimed is:

1. A scanning electron microscope including a multiply-segmented backscattered electron detector for detecting a backscattered electron emitted from the surface of a sample as the surface of the sample is two-dimensionally scanned with an electron beam, the scanning electron microscope comprising:
    a signal switching section for switching detection signals from the segmented backscattered electron detector after every scanning unit;
    a memory having storage regions of the number of the segments of the backscattered electron detector; and
    a control section for switching the detection signals and the storage regions of the memory for every signal detection processing of a single scanning unit, for acquiring image data in scanning units of the number of the divisions, and for performing a calculation processing for three-dimensional shape measurement on the basis of the position of the backscattered electron detector and the intensity of the detection signal.

2. The scanning electron microscope according to claim 1, wherein the single scanning unit is any one of a frame unit and a line unit.

3. The scanning electron microscope according to claim 1, further comprising:
    a beam blanking section for preventing a sample from being irradiated with an electron beam;
    a brightness adjusting section for adjusting brightness; and
    a means for setting the brightness adjusting section so that image data obtained in the state where the beam blanking section is in operation to prevent the sample from being irradiated with an electron beam is a known value including offset zero.

4. The scanning electron microscope according to claim 1, further comprising:
    a beam blanking section for preventing a sample from being irradiated with an electron beam;
    a brightness adjusting section for adjusting brightness;
    a recoding section for recording image data obtained in a known brightness setting while the beam blanking section is in operation; and
    a means for calculating a difference between the known brightness set value and a value obtained by multiplying the image data recorded in the recording section by a certain coefficient, for adding the difference and the known brightness set value with each other and then setting a value thus obtained in the brightness adjusting section, and for retaining the setting in the brightness adjusting section during the acquisition of image data for three-dimensional shape measurement.

5. The scanning electron microscope according to claim 1, further comprising:
    a beam blanking section for preventing a sample from being irradiated with an electron beam;
    a recording section for recording image data obtained in the state where irradiation of an electron beam on a sample is prevented by use of the beam blanking section; and
    a computing section for performing a computing processing for three-dimensional shape measurement by use of a value obtained by subtracting image data obtained in the state where electron beam irradiation is prevented, from scan unit size image data, obtained by electron beam scanning, of the number of the divisions.

6. The scanning electron microscope according to claim 1, further comprising an A/D converter for image data conversion;

a contrast adjusting section for adjusting contrast;

a recording section for recording a maximum value of image data obtained in a known contrast setting; and a means for multiplying the ratio between the maximum value of the image data and the full scale value of the A/D converter by a certain set coefficient, for multiplying a value thus obtained by the known contrast set value and then setting a value thus obtained in the contrast adjusting section, and for retaining the setting in the contrast adjusting section during the acquisition of image data for three-dimensional measurement.

7. A scanning electron microscope including a detector for detecting a signal emitted from the surface of a sample when the surface of the sample is two-dimensionally scanned with an electron beam, the scanning electron microscope comprising:

an A/D converter for image data conversion;

a contrast adjusting section;

a recording section for recording a maximum value of image data obtained in a known contrast setting; and a means for multiplying the ratio between the maximum value of image data and a full-scale value of the A/D converter by a certain set coefficient, for multiplying a value thus obtained by the known contrast set value, and for setting a value thus obtained in the contrast adjusting section.

8. A scanning electron microscope including a detector for detecting a signal emitted from the surface of a sample when the surface of the sample is two-dimensionally scanned with an electron beam, the scanning electron microscope comprising:

an A/D converter for image data conversion;

a contrast adjusting section;

a histogram acquisition section for acquiring a histogram of image data; and a means for acquiring a histogram of image data obtained in a known contrast setting, for calculating the ratio between a certain set image data value and an image data value corresponding to a frequency obtained by multiplying a total frequency of the image data by a certain set proportion, for multiplying the ratio by the known contrast set value, and for setting a value thus obtained in the contrast adjusting section.

* * * * *